United States Patent [19]

Morita et al.

[11] Patent Number: 4,654,229
[45] Date of Patent: Mar. 31, 1987

[54] METHOD FOR THE PRODUCTION OF SUBSTRATES WITH A UNIFORM DISPERSION OF EXTREMELY FINE GRANULES

[75] Inventors: Tatsuo Morita, Kyoto; Yoshiharu Nakajima, Tenri; Shigeo Nakajima, Nara, all of Japan

[73] Assignee: Sharp Kabushiki Kaisha, Osaka, Japan

[21] Appl. No.: 822,742

[22] Filed: Jan. 27, 1986

[30] Foreign Application Priority Data

Jan. 31, 1985 [JP] Japan .................................. 60-18875

[51] Int. Cl.$^4$ .............................................. B05D 1/12
[52] U.S. Cl. .................... 427/180; 118/715; 118/720; 118/728; 118/308; 427/196; 427/250; 427/248.1
[58] Field of Search ............... 118/715, 720, 728, 308; 427/180, 196, 255.7, 250, 248.1

[56] References Cited

U.S. PATENT DOCUMENTS

| | | | |
|---|---|---|---|
| 4,098,919 | 7/1978 | Morimoto et al. | 427/250 X |
| 4,152,478 | 5/1979 | Takagi | 427/248.1 |
| 4,217,855 | 8/1980 | Takagi | 118/719 |
| 4,395,440 | 7/1983 | Abe et al. | 427/180 |

FOREIGN PATENT DOCUMENTS

| | | |
|---|---|---|
| 0061906 | 10/1982 | European Pat. Off. . |
| 2601066 | 8/1978 | Fed. Rep. of Germany . |
| 2547552 | 10/1978 | Fed. Rep. of Germany . |
| 907999 | 10/1962 | United Kingdom . |
| 962868 | 7/1964 | United Kingdom . |
| 990288 | 4/1965 | United Kingdom . |
| 1085898 | 10/1967 | United Kingdom . |
| 1394655 | 5/1975 | United Kingdom . |
| 1515571 | 6/1978 | United Kingdom . |
| 1558786 | 1/1980 | United Kingdom . |
| 1598051 | 9/1981 | United Kingdom . |

OTHER PUBLICATIONS

Takagi et al, J. Vac. Sci. Technol., vol. 12:1128–1134.

*Primary Examiner*—Shrive P. Beck
*Attorney, Agent, or Firm*—Ciotti & Murashige

[57] ABSTRACT

A method for the production of substrates with a uniform dispersion of extremely fine granules comprising: forming extremely fine granules in a granule-formation chamber under a reduced pressure by a gas-evaporation technique, introducing said extremely fine granules into a granule-recovering chamber under high vacuum, which is adjacent to said granule-formation chamber, through a slit formed in the partition between said granule-formation chamber and said granule-recovering chamber, and allowing said extremely fine granules to be dispersed on and attached to a supporter disposed in said granule-recovering chamber.

4 Claims, 4 Drawing Figures

1000Å

1000Å

1000Å

METHOD FOR THE PRODUCTION OF SUBSTRATES WITH A UNIFORM DISPERSION OF EXTREMELY FINE GRANULES

BACKGROUND OF THE INVENTION

1. Field of the Invention

This invention relates to a method for the production of substrates with a uniform dispersion of extremely fine granules.

2. Description of the Prior Art

A gas-evaporation technique, in which a metal semiconductor or a dielectric is heated causing evaporation of extremely fine granules onto a supporter in an inert gas atmosphere at low pressure (e.g., from 0.1 to 10 Torrs), resulting in a substrate on which extremely fine granules are dispersed, is well known. The substrate formed by the above-mentioned method is used as a base for the production of a medium for magnetic recording in the field of information processing, the production of catalysts in chemistry, the production of various kinds of sensor materials, and the production of electric circuit devices such as switch devices, memory devices, diodes, etc.

However, when this method is used, generally speaking, several or several tens of extremely fine granules are recovered in a coupled form, and it is not possible to obtain uniform dispersion with minute spaces between the granules on the supporter. The reason for this phenomenon is as follows: In this method, the extremely fine granules, which are formed in the gas with diameters ranging from tens to thousands of Angstroms, collide repeatedly with gas molecules, so that the kinetic energy of the initial stage is rapidly lost, and the granules are carried by a convection stream of gas, which is caused by the heat of a heat source for the evaporation, and accumulated on the supporter. Thus, the distance in which the granules are in motion in the gas before arriving at the supporter becomes very long. This process of transportation seems to be the cause of the successive aggregations of granules touching each other. When the extremely fine granules are coupled with each other on the supporter, the regions of coupled fine granules become, in effect, regions of large granules, and the physical and chemical characteristics of the extremely fine granules are lost. For that reason, if such a dispersed substrate of extremely fine granules is used, for example, for sensor materials or materials for electronic circuits, the proportion of unsatisfactory production increases, and it is not possible to ensure the production reliability of the electronic parts, etc., constructed using this substrate.

SUMMARY OF THE INVENTION

The method for the production of substrates with a uniform dispersion of extremely fine granules according to this invention which overcomes the above-discussed and numerous other disadvantages and deficiencies of the prior art, comprises forming extremely fine granules in a granule-formation chamber under a reduced pressure by a gas-evaporation technique, introducing said extremely fine granules into a granule-recovering chamber under high vacuum, which is adjacent to said granule-formation chamber, through a slit formed in the partition between said granule-formation chamber and said granule-recovering chamber, and allowing said extremely fine granules to be dispersed on and attached to a supporter disposed in said granule-recovering chamber.

The partition is, in a preferred embodiment, provided with a throttling mechanism which attains a variable control of the diameter of said slit to thereby adjust the pressure difference between said granule-formation chamber and said granule-recovering chamber.

The supporter is, in a preferred embodiment, cooled by a cooling means while said extremely fine granules are being dispersed on and attached to said supporter.

The method of this invention which overcomes the above-discussed and numerous other disadvantages and deficiencies of the prior art, further comprises evaporating a dispersion medium composed of evaporable materials contained in said granule-recovering chamber, and allowing said extremely fine granules to be dispersed on and attached to said supporter, together with said evaporated dispersion medium.

Thus, the invention described therein makes possible the objects of (1) providing a method for the production of substrates with a uniform dispersion of extremely fine granules being achieved without coupling with each other; and (2) providing a method for the production of substrates in which extremely fine granules formed by a gas-evaporation technique are uniformly dispersed on a supporter without the successive aggregation of granules, thereby producing an extremely fine granule-dispersed substrate which is useful in fields where the characteristics of extremely fine granules are utilized.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Figure 1:
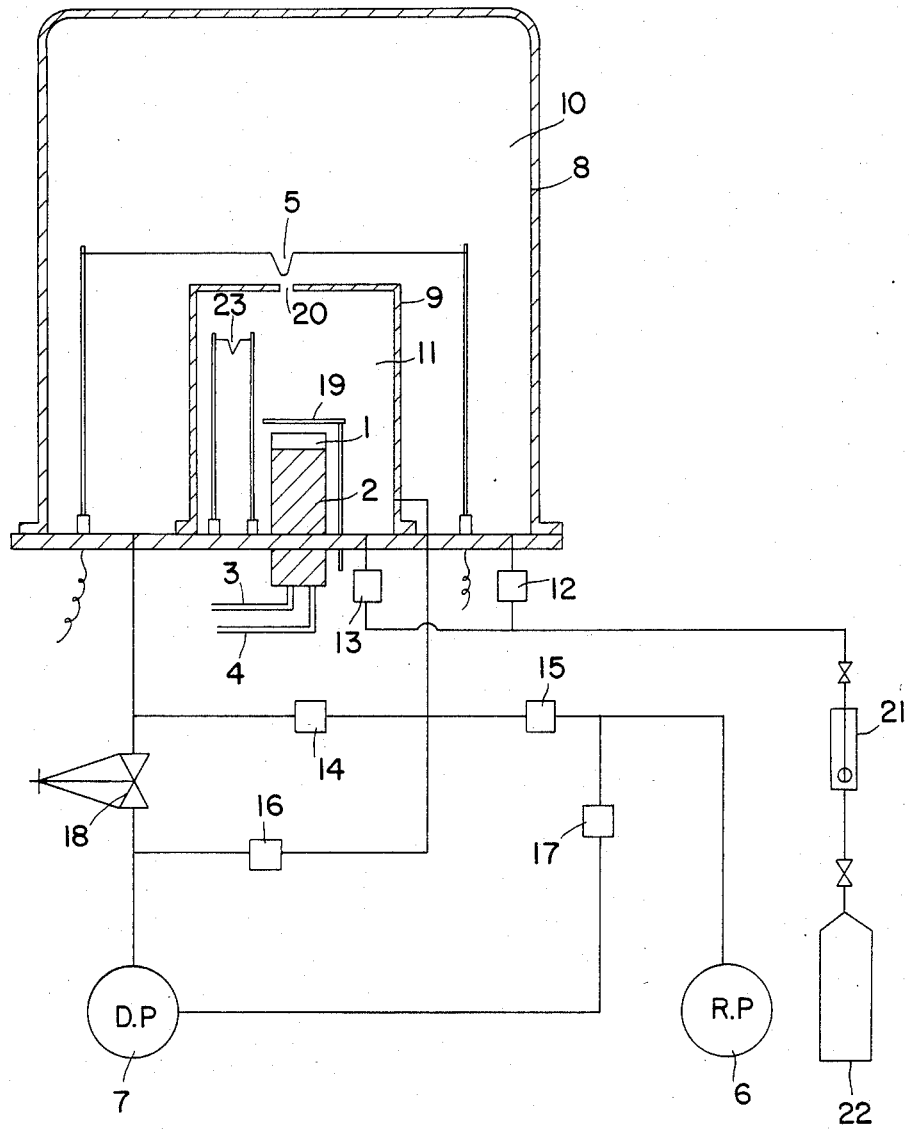
FIG. 1 is a schematic diagram showing an apparatus for the production of substrates of this invention.

FIG. 1 shows an apparatus for producing a substrate on which extremely fine granules are uniformly dispersed according to this invention. The apparatus has a double structure consisting of an outer verger 8 and an inner verger 9. The chamber 10 between the vergers 8 and 9 is under a reduced pressure and the chamber 11 inside of the verger 9 is under high vacuum. In the chamber 11, a supporter 1 to allow extremely fine granules to be accumulated thereon is held by a holder 2, which is cooled by a cooling medium recycling through a pouring conduit 3 and a discharging conduit 4. A boat 5, which contains an evaporable material generating extremely fine granules when heated, is disposed in the chamber 10.

Alternatively, the boat 5 can be disposed in the chamber 11 and the supporter 1 can be disposed in the chamber 10, if the chamber 10 is under high vacuum and the chamber 11 is under a reduced pressure.

The gas for the maintenance of the reduced pressure in the chamber 10 or 11 comes from a gas cylinder 22 via valve 12 or 13 (e.g., valve 12) to the chamber 10 or 11 (e.g., chamber 10). Removal of the gas from the chambers 10 and 11 is carried out by operation of valves 14, 15, 16, 17 and 18 connected to and oil-sealed rotary pump 6 and an oil diffusion pump 7. After removal of the gas from the chambers 10 and 11 is carried out to attain high vacuum therein, the valve 16 alone is kept open to continue removal from the chamber 11 while the valve 12 is left slightly open to introduce the gas from the cylinder 22 into the chamber 10. The amount of gas to be introduced into the chamber 10 is being monitored using a flow meter 21. Thus, the pressure in chamber 10 is reduced, whereas the chamber 11 is maintained under high vacuum. The pressure ratio of the chamber 10 to the chamber 11 depends upon the diameter of the slit 20 formed on the upper wall of the inner verger 9. For example, when the slit 20 is formed with a diameter of 300 $\mu$m and argon gas is introduced into the chamber 10, the pressure ratio is in the range of $10^2$ to $10^4$.

Using the above-mentioned apparatus, a substrate on which extremely fine granules are uniformly dispersed is produced as follows: The pressure of the chamber 10 is set in the range of around 0.01 to 10 Torrs and that of the chamber 11 is set in the range of around $10^{-5}$ to $10^{-6}$ Torrs. Then, the boat 5 which is positioned above the slit 20 of the inner verger 9 is heated, resulting in evaporation of the evaporable materials contained in the boat 5. As the evaporation method, a resistance heating method, an electron beam irradiation method, a laser light irradiation method, a plasma- or ion-sputtering method, etc., can be used. The evaporated atoms from the evaporable materials collide repeatedly with each other in the atmosphere under a reduced pressure, resulting in extremely fine granules, which are then drawn into the vacuum chamber 11 via the slit 20 to be dispersed and accumulated on the supporter 1. The start and termination of the arrival of granules at the supporter 1 depend upon the opening and closing of a shielding board 19, which is disposed above the supporter 1. Since the extremely fine granules which are formed in the chamber 10 are instantly drawn into the chamber 11 through the slit 20, they maintain their exist in a granule form without coupling with each other. As the evaporable materials generating the extremely fine granules, metals such as Cu, Zn, Au, Pt, Al, Ha, Ti, V, Cr, Mn, Fe, Co, Ni, Sn, Pb, etc.; semiconductors such as Si, Ge, GaAs, Te, $SnO_2$, CdS, CdTe, etc.; or dielectrics such as $VO_2$, $TiO_x$, $BaTiO_x$, etc., can be used. As the supporter 1 on which the extremely fine granules from these materials are recovered, a silicon wafer, a plastic film, and other organic and inorganic materials depending upon the purpose of use thereof can be employed.

In order to set a proper difference in the pressure between the chambers 10 and 11, a throttling mechanism which allows variable control of the diameter of the slit 20 can be added to an appropriate portion (e.g., the partition near the slit 20) of the above-mentioned apparatus. Alternatively, variable control of the amount of exhaust gas from the chambers 10 and 11 can be made by the adjustment of the valves 14, 15, 16, 17 and/or 18 which allow the adjustment of the pressure difference between the chambers 10 and 11.

The reason why the supporter 1 is preferably cooled by a cooling medium through the holder 2, is that when the supporter 1 is cooled, the extremely fine granules which have arrived at the supporter 1 rapidly lose their kinetic energy so that correction of extremely fine granules on the supporter 1 can be attained with high efficiency.

EXAMPLE 2

In order to attain a more effective dispersion of the extremely fine granules on the supporter 1, it is preferable to allow materials, which function as a dispersion medium for the extremely fine granules, to be evaporated within the chamber 11. For this purpose, as shown in FIG. 1, a boat 23 containing such materials therein (e.g., $SiO_2$ or any other evaporable substances) as a dispersion medium is disposed within the chamber 23. The production of substrates on which extremely fine granules are uniformly dispersed, using this dispersion medium, according to this invention is as follows: The pressure of each of the chambers 10 and 11 is, first, set at a given level in the same manner as in Example 1. Then, the materials in the boat 5 are allowed to evaporate in the heat, resulting in extremely fine granules, which are then introduced into the chamber 11 through the slit 20. Also, the boat 23 disposed within the chamber 11 is heated, and the dispersion medium in the boat 23 allow to be evaporated. The extremely fine granules which have been introduced into the chamber 11 are accumulated on the supporter 1, together with the evaporated dispersion medium, and uniformly dispersed on the supporter 1. The dispersion medium is located among the extremely fine granules in such a manner that the extremely fine granules can be uniformly dispersed with minute spaces between the granules on the supporter 1, and thus the uniform dispersion effect of the extremely fine granules increases.

Figure 2A:
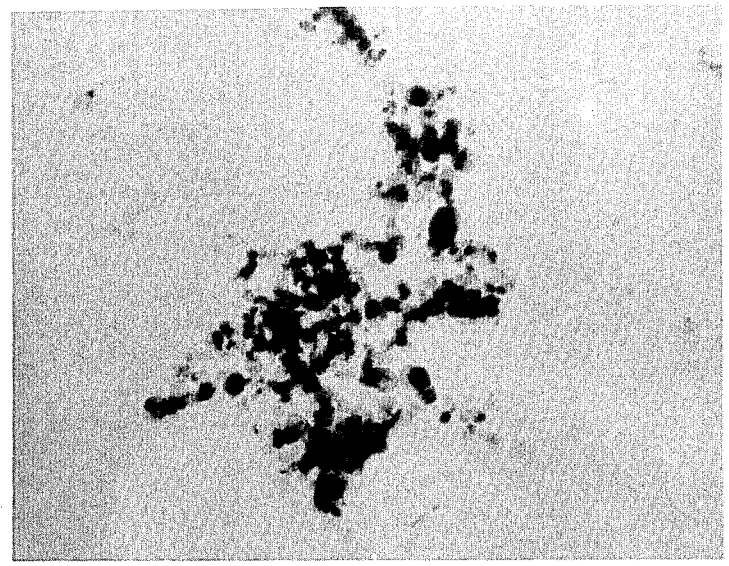
FIG. 2(A) is a microphotograph showing the dispersion structure of extremely fine granules of Cu on a supporter, which was produced by a conventional gas-evaporation technique.

FIG. 2(A) shows a microphotograph showing a conventional dispersion structure of extremely fine granules of Cu on a supporter, which was produced according to a conventional gas-evaporation technique (argon atmosphere under 5 Torrs). FIG 2(A) indicates that a number of the extremely fine granules are aggregated in a chain fashion.

Figure 2B:
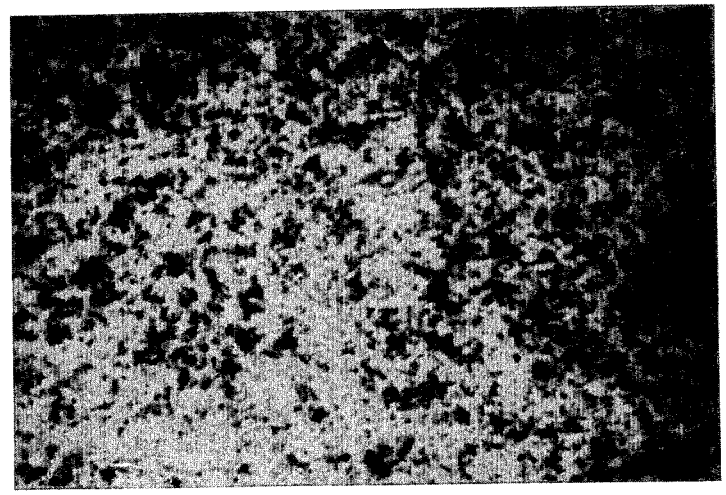
FIG. 2(B) is a microphotograph showing the dispersion structure of extremely fine granules of Cu on a supporter, which was produced according to this invention.

FIG. 2(B) shows a microphotograph showing a dispersion structure of extremely fine granules of Cu on a supporter, which was produced according to Example 1 of this invention, wherein the chamber 10 was charged with an argon atmosphere under 5 Torrs and the chamber 11 with an argon atmosphere under 0.05 Torrs. FIG. 2(B) indicates that the extremely fine granules are uniformly dispersed on the supporter without coupling with each other, as compared with those in FIG. 2(A).

Figure 2C:
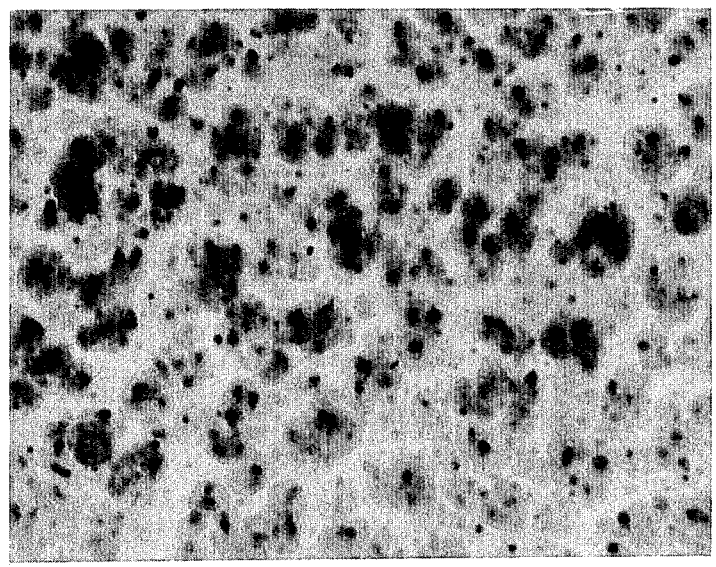
FIG. 2(C) is a microphotograph showing the dispersion structure of extremely fine granules of Cu on a supporter, which was produced, using a dispersion medium, according to this invention.

FIG. 2(C) shows another microphotograph showing a dispersion structure of extremely fine granules of Cu on a supporter, which was produced, using $SiO_2$ as the above-mentioned dispersion medium, according to Example 2 of this invention, wherein the chamber 10 was charged with an argon atmosphere under 3 Torrs and the chamber 11 with an argon atmosphere under 0.05 Torrs. FIG. 2(C) indicates that each of the extremely fine granules of Cu nucleates and the SiO phase surrounds the nucleus, resulting in a uniform dispersion of the extremely fine granules in the SiO phase on the supporter.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A method for the production of substrates with a uniform dispersion of extremely fine granules comprising:

forming extremely fine granules in a granule-formation chamber under a reduced pressure by a gas-evaporation technique, introducing said extremely fine granules into a granule-recovering chamber under high vacuum, which is adjacent to said granule-formation chamber, through a slit formed in the partition between said granule-formation chamber and said granule-recovering chamber, and allowing said extremely fine granules to be dispersed on and attached to a supporter disposed in said granule-recovering chamber.

2. A method for the production of substrates with a uniform dispersion of extremely fine granules according to claim 1, wherein said partition is provided with a throttling mechanism which attains a variable control of the diameter of said slit to thereby adjust the pressure difference between said granule-formation chamber and said granule-recovering chamber.

3. A method for the production of substrates with a uniform dispersion of extremely fine granules according to claim 1, wherein said supporter is cooled by a cooling means while said extremely fine granules are being dispersed on and attached to said supporter.

4. A method for the production of substrates with a uniform dispersion of extremely fine granules according to claim 1, which further comprises evaporating a dispersion medium composed of evaporable materials contained in said granule-recovering chamber, and allowing said extremely fine granules to be dispersed on and attached to said supporter, together with said evaporated dispersion medium.

* * * * *